United States Patent
Yip

(10) Patent No.: US 8,649,728 B2
(45) Date of Patent: Feb. 11, 2014

(54) FINGER SENSING APPARATUS AND METHOD

(75) Inventor: Chak Lam Peter Yip, Hong Kong (HK)

(73) Assignee: Oxbridge Creation Limited, Hong Kong (HK)

( * ) Notice: Subject to any disclaimer, the term of this patent is extended or adjusted under 35 U.S.C. 154(b) by 775 days.

(21) Appl. No.: 12/864,236

(22) PCT Filed: Jan. 12, 2009

(86) PCT No.: PCT/CN2009/070101
§ 371 (c)(1),
(2), (4) Date: Jul. 22, 2010

(87) PCT Pub. No.: WO2009/094918
PCT Pub. Date: Aug. 6, 2009

(65) Prior Publication Data
US 2010/0328264 A1 Dec. 30, 2010

Related U.S. Application Data

(60) Provisional application No. 61/023,881, filed on Jan. 27, 2008.

(51) Int. Cl.
*G09B 5/00* (2006.01)
(52) U.S. Cl.
USPC .............. 434/317; 345/174; 434/355

(58) Field of Classification Search
USPC .......................................... 434/317
See application file for complete search history.

(56) References Cited

U.S. PATENT DOCUMENTS

| | | | | |
|---|---|---|---|---|
| 5,880,718 A * | 3/1999 | Frindle et al. | ................. | 345/174 |
| 5,920,309 A | 7/1999 | Bisset et al. | | |
| 6,064,855 A * | 5/2000 | Ho | ................. | 434/317 |
| 6,437,583 B1 * | 8/2002 | Tartagni et al. | ................. | 324/687 |
| 2004/0043365 A1 * | 3/2004 | Kelley et al. | ................. | 434/178 |

FOREIGN PATENT DOCUMENTS

| | | |
|---|---|---|
| CN | 2285923 Y | 7/1998 |
| CN | 2572482 Y | 9/2003 |
| CN | 2821736 Y | 9/2006 |
| CN | 101093990 A | 12/2007 |

\* cited by examiner

*Primary Examiner* — Alexander S Beck
*Assistant Examiner* — Charles Zheng
(74) *Attorney, Agent, or Firm* — Eagle IP Limited; Jacqueline C. Lui

(57) ABSTRACT

A finger-sensing apparatus (23) and a method with a page detection mechanism (47). The apparatus (23) comprises a finger-sensitive substrate (26) having a plurality of keypads (30), a page detection mechanism (47), a control circuit (31) and a pliable media (25). When a finger (33) of a user is proximate to a keypad (30), the control circuit (31) detects a change in a characteristic at the keypad (30). The page detection mechanism (47) determines a page (24) exposed to the user and sends the information to the control circuit (31). The characteristic is a capacitance.

11 Claims, 15 Drawing Sheets

FINGER SENSING APPARATUS AND METHOD

CROSS-REFERENCE TO RELATED APPLICATIONS

This application claims benefit under 35 U.S.C. §119(e) of U.S. Provisional Application having Ser. No. 61/023,881 filed Jan. 27, 2008, which is hereby incorporated by reference herein in its entirety.

FIELD OF INVENTION

This invention relates to an interactive electronic apparatus and in particular a finger-sensing apparatus with page detection mechanism.

BACKGROUND OF INVENTION

Touch-sensitive books are widely used in educational applications. It is usually a paper book with touch-sensitive markers at certain locations so that when a person places his finger to touch the markers, an audio or multimedia message is output. This type of books is intuitive and interactive, and increases the fun of reading. Hence it allows learning and entertainment even without the guidance of an adult. There are currently many kinds of touch-sensitive books in the market, and the touch-sensing methods can be grouped into four main categories. The first one is by using a stylus to sense the marker. A radio frequency (RF) wave is used for sensing. The second one is by printing an identification code on the medium, and using a stylus to read that code by optical or magnetic methods. The third one is by using a radio frequency (RF) wave to directly detect the presence of a finger. The last one is by providing mechanical switches beneath the markers. When the book has a large stack of pages, there is a need to provide a page detection mechanism to detect which page the user is viewing, as well as a reliable finger-sensing apparatus so that the system as a whole yields high accuracy in determining which area in that page the user touches without giving annoying false triggers.

SUMMARY OF INVENTION

It is an object of the present invention to provide an alternate finger-sensing apparatus that detects a presence of a finger at a location and with page detection mechanism.

An exemplary embodiment of the invention is an apparatus, comprising a pliable substrate comprising at least one finger-sensitive touch sensor, a page detection mechanism for determining a page exposed to a user; and a control circuit coupled to the at least one finger-sensitive touch sensor and the page detection mechanism to indicate a specific page being displayed to the user and a specific site on the substrate activated with a finger of the user.

An alternative embodiment of this invention is an interactive electronic book comprising a substrate comprising at least one finger-sensitive touch sensor; a pliable media including at least one page with at least one site; with the pliable media removably attached on top of said substrate; a page detection mechanism that determines a page exposed to a user; a control circuit that receives an indication from the page detection mechanism of a current page being displayed and an indication from the finger-sensitive touch sensor of a location on the page being touched by a user; a memory device coupled to that control circuit and storing a multimedia object that corresponds to the site of the page; a multimedia output device coupled to the control circuit that presents that multimedia object to the user.

In one embodiment, the substrate is a pliable membrane. In another embodiment, the finger-sensitive touch sensor is a capacitive touch sensor.

In yet another embodiment, the page detection mechanism comprises a strip attached to different locations of said page; and a strip detecting circuit coupled to the control circuit. When the strip moves from a first position to a second position as the user flips the page; the strip detecting circuit detects the movement of that strip and sends out at least one control signal to the control circuit, indicating the specific page that the user flips.

To save electrical power, the interactive electronic book enters a sleep mode when not used for a pre-defined period of time. When the page detection mechanism detects the movement of a page, the book is switched to an active mode.

In one embodiment, the page detection mechanism, the memory device and the pliable media form a book that is separated from the finger-sensitive touch platform. In another embodiment, the book has a spine and the page detection mechanism is built into the spine of the book.

In a further embodiment, electric power is supplied to the book and the page detection mechanism only after a certain time period when it is attached to the finger-sensitive touch platform. This implementation reduces the chance that lingering charges at connectors may damage the electronic parts.

In another aspect of the invention, a method is described that comprises determining which one of plural pages are displayed to a user; detecting a presence of a finger of the user when the finger is proximate a site in that page; activating a multimedia object that corresponds to the site on that page.

BRIEF DESCRIPTION OF FIGURES

FIG. 4b is the layout of a keypad of FIG. 4a.

DETAILED DESCRIPTION OF THE PREFERRED EMBODIMENTS

Figure 1:
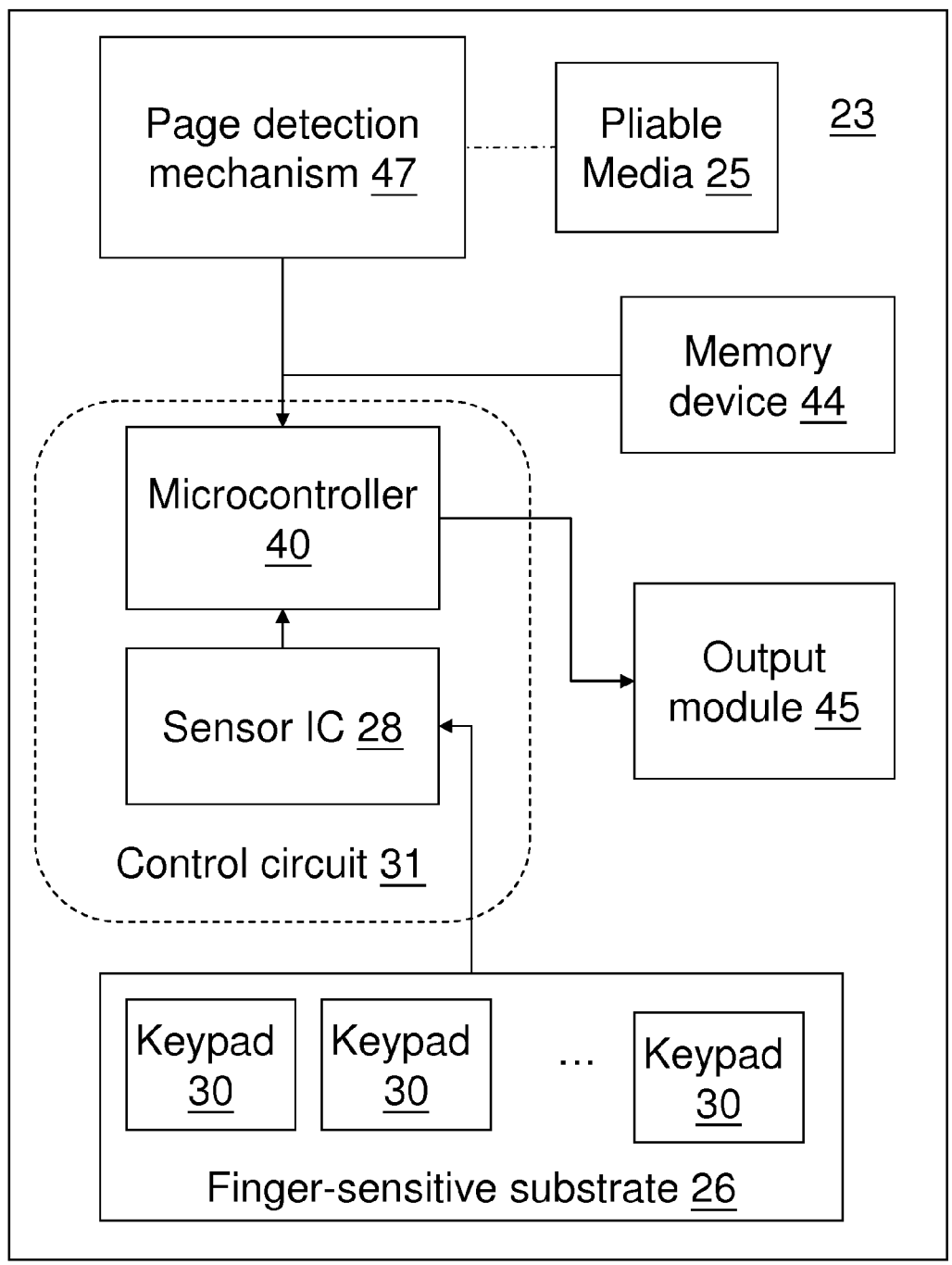
FIG. 1 is a block diagram showing the major electronic components of an exemplary embodiment of the present invention.

A first embodiment of the present invention is a finger-sensing apparatus 23 of which a block diagram is shown on FIG. 1. It comprises a finger-sensitive substrate 26, a memory device 44, a page detection mechanism 47 and an output module 45, all coupled to a control circuit 31. The control circuit 31 comprises a microcontroller 40 and a sensor integrated circuit (IC) 28. A pliable media 25 that comprises a plurality of pages is provided for a user to view, and is mechanically attached to the page detection mechanism 47. The page detection mechanism 47 is configured to send the page number that the user is viewing to the control circuit 31. The finger-sensitive substrate 26 comprises a plurality of keypads 30. The memory device 44 stores a plurality of multimedia objects. In one embodiment, the pliable media is a book, and each page of the book comprises markers corresponding to the locations of the keypads 30 of the finger-sensitive substrate 26. The output module 45 may be an audio amplifier with a loudspeaker that outputs a voice message.

In operation, when a user is viewing a certain page of the pliable media and put his finger near one of the keypads 30, the sensor IC 28 detects the presence of the finger and sends out a trigger signal to the microcontroller 40. Together with the page information from the page detection mechanism 47, the microcontroller retrieves the corresponding multimedia object from the memory device 44 and sends it to the output module 45. The latter then presents it to the user.

There are many methods to detect whether a user finger is proximate to a keypad 30. One approach is to measure the change of capacitance at the keypad 30. An exemplary embodiment of realizing this approach is described below and shown in FIG. 2. In this embodiment, at least one conductive material is deposited on the finger-sensitive substrate 26 to form a circuit board. The circuit board thus formed comprises the keypads 30, a ground layer 32 surrounding the keypads 30 and a plurality of conducting wires 34. Each keypad 30 is electrically coupled to at least one of the conducting wires 34, and each conducting wire 34 is coupled to one of a plurality of input/output (I/O) ports 36 of the sensor IC 28 that is external to the keyboard 27.

In operation, the sensor IC 28 first sends out square pulses from one of the I/O ports 36 to at least one keypad 30 through the conducting wire 34. The conducting wire 34 has a distributed resistance that depends on material resistivity, the length and the width of the conducting wire 34. A very small capacitance represented by a capacitor 38 also exists at the keypad 30. Therefore, the I/O ports 36 are coupled to an equivalent resistor-capacitor (RC) circuit that acts as a low pass filter. According to electrical principles, when a voltage step function is applied to the input of the low-pass RC filter, the voltage at the output which is the keypad 30 rises or falls slowly in a continuous, exponentially decaying curve. The rate of rising or falling is determined by a parameter called time constant τ, which is the product of the resistance and the capacitance.

Figure 3A:
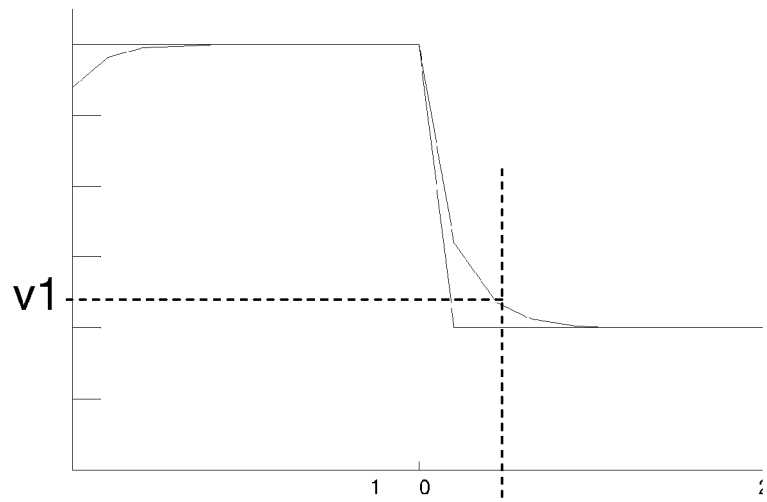
FIG. 3a is a wave diagram of a detecting method according to an exemplary embodiment when a finger is not proximate to a keypad.

A wave diagram according to an exemplary embodiment is shown in FIG. 3*a*. During the high voltage period of the pulse, the keypad 30 is fully charged up to the same voltage level as that of the I/O port 36. After the negative edge of the pulse, the voltage at the keypad 30 starts to fall at a rate as a function of the time constant τ. At a predetermined time period indicated by t1, the voltage at the keypad 30 is measured.

Figure 2:
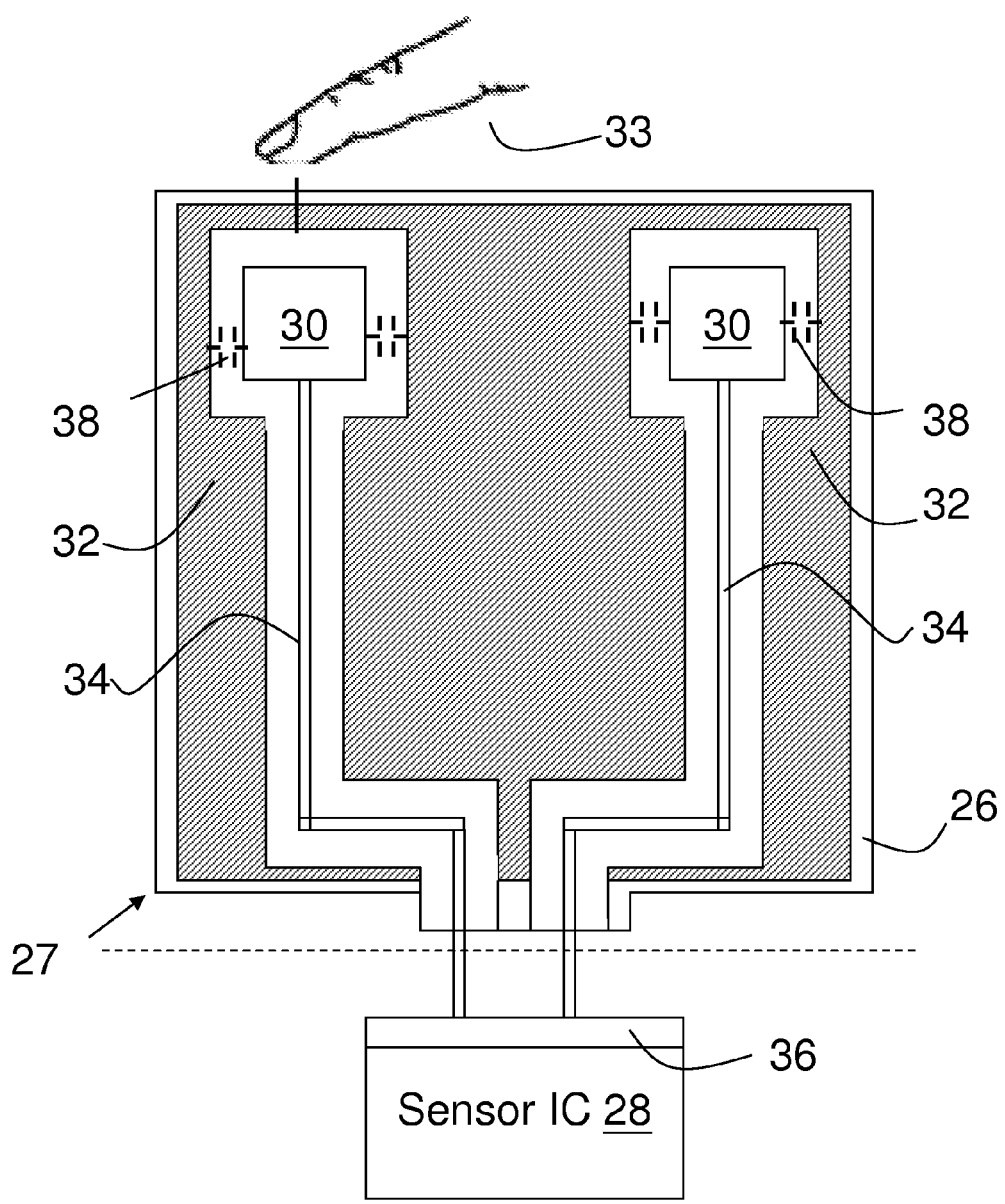
FIG. 2 is a layout of a finger-sensitive substrate according to an exemplary embodiment.

Referring to FIG. 2, when a finger 33 is not in the proximity of the keypads 30, the voltage measured is regarded as a reference value, and this reference value is saved in the sensor IC 28. When a user places the finger 33 in the proximity of the keypad 30, the finger 33 distorts the electric field lines around the keypad 30 and increases the capacitance significantly at the keypad 30. Increase in capacitance leads to a higher time constant which in turns causes the voltage at the keypad 30 to rise or fall at a slower rate. Hence by measuring the differences of voltage rise-time or fall-time, one can deduce that a change of the time constant occurs. As this is caused by a change of capacitance at the keypad 30, the sensor IC 28 can then determine that a finger is in proximity to this keypad 30 and sends out a trigger signal.

Figure 3B:
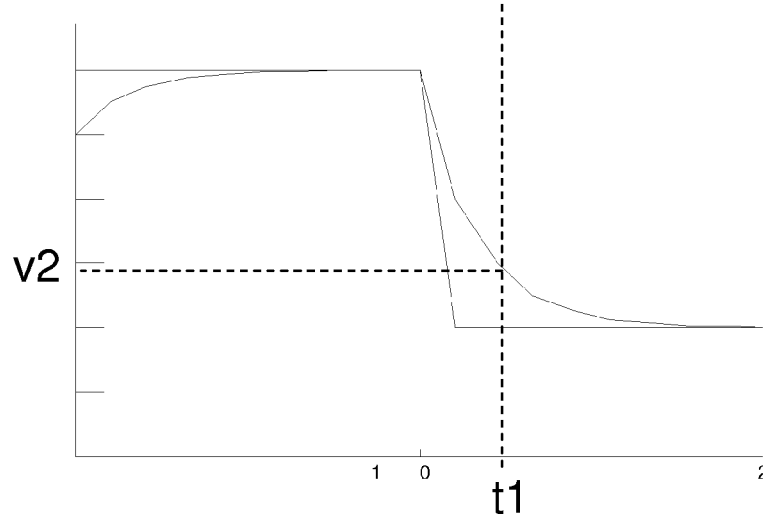
FIG. 3b is a wave diagram of FIG. 3a when the finger is proximate to the keypad.

Referring to FIGS. 3*a* and 3*b*, one method to detect the capacitance change is to measure the voltage at the time t1. When the finger 33 is not proximate to the keypad 30, the voltage is measured as v1 in FIG. 3*a*, and is saved inside the sensor IC 28 as a reference value. When the finger 33 is proximate to the keypad 30, a higher voltage is measured at the I/O port 36 at the time t1, as indicated by v2 in FIG. 3*b*. The sensor IC 28 compares the voltage v2 with the reference value v1, and if the difference is greater than a predetermined threshold, the sensor IC 28 regards that the finger 33 is detected at that I/O port 36 and a trigger signal is sent to the microcontroller 40. The above processes are repeated for each I/O port 36 in rotation.

In another embodiment, the sensor IC 28 generates the trigger signal only when the voltage difference that is above the predetermined threshold occurs within a short time-interval. In yet another embodiment, unless the voltage difference rises above a first threshold within a first time-interval, and falls below a second threshold within a second time interval does the sensor IC 28 generate the trigger signal.

Figure 4A:
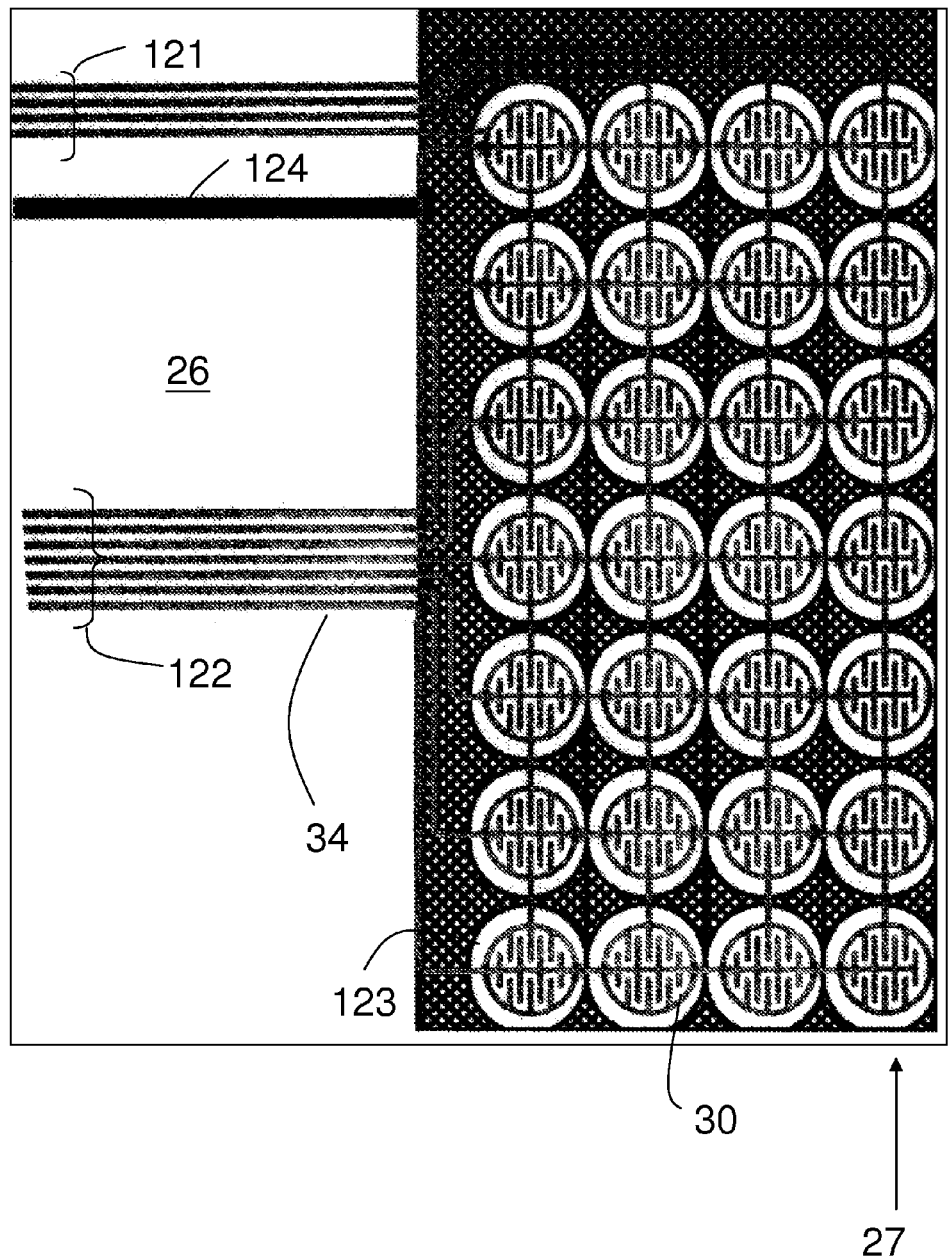
FIG. 4a is an exemplary layout of a finger-sensitive substrate.
Figure 4B:
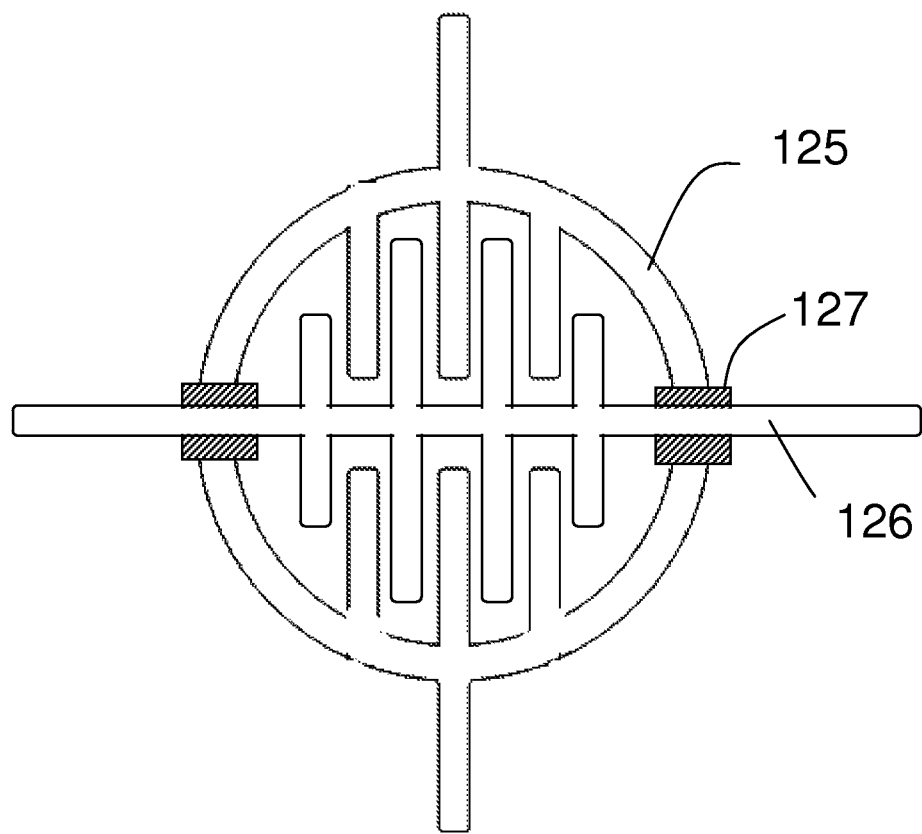
Figure 4C:
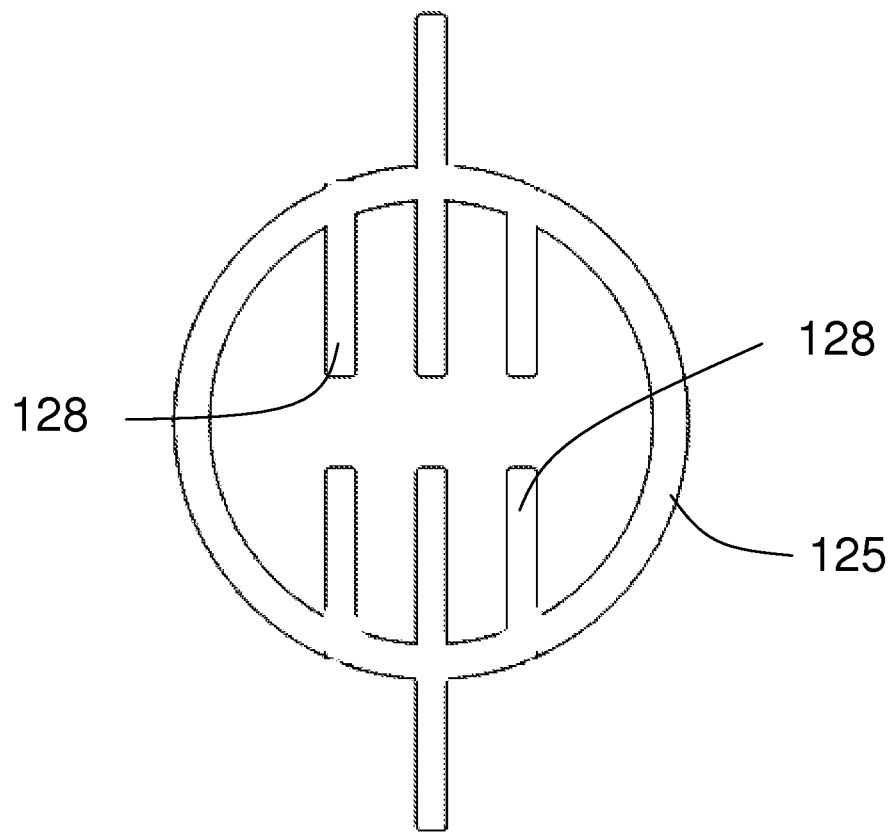
FIG. 4c is the layout of a column pattern of FIG. 4b.
Figure 4D:
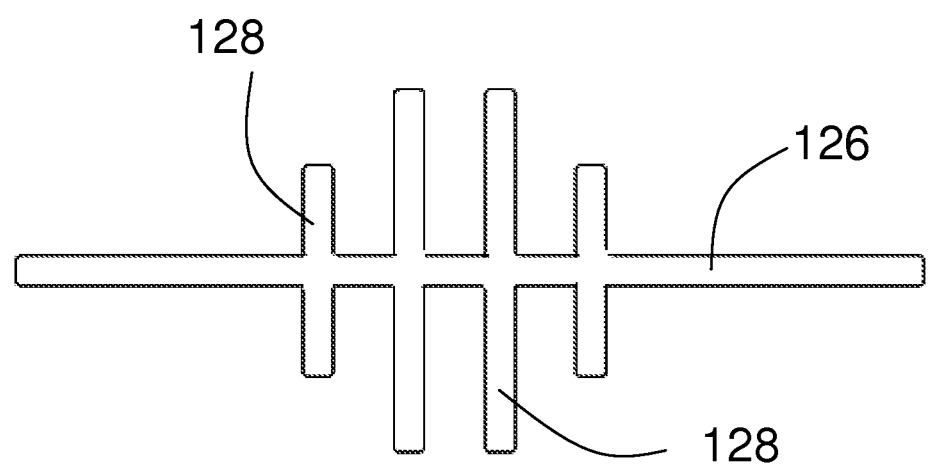
FIG. 4d is the layout of a row pattern of FIG. 4b.

An exemplary layout of the finger-sensitive substrate 26 is illustrated in FIGS. 4*a*-4*d*. Conductive material is deposited on both sides of the finger-sensitive substrate 26. On one side of the finger-sensitive substrate 26, the conductive material forms twenty-eight keypads 30 that are arranged in a matrix of seven rows and four columns. Each keypad is formed by two patterns of conductive wires, one placed on top of the other as shown in FIG. 4*b*. In this embodiment, the two patterns are shown in FIG. 4*c* and FIG. 4*d*. We refer the pattern shown in FIG. 4*c* as column-pattern 125 and that shown in FIG. 4*d* as row-pattern 126. Column patterns 125 in each column are connected together by a column conductive wire. Since there are four columns of keypads, the four column conductive wires are grouped together and run to the edge of the finger-sensitive substrate 26 as column wire bundles 121. Similarly, row patterns 126 in each row are connected together by a row conductive wire. The seven row conductive wires are grouped together and run to the edge of the finger-sensitive substrate 26 as row wire bundles 122. External electrical connectors (not shown in figures) connects each of the conductive wires in column wire bundles 121 and row wire bundles 122 to an individual I/O port 36 of the sensor IC 28 (not shown in figures). It should be noted that where column conductive wires crosses row conductive wires, an insulating material is deposited in-between these two conductive wires so that voltage signal from one conductive wire does not pass through to other conductive wires, as shown in FIG. 4b as insulating pads 127.

In this exemplary embodiment, the column pattern 125 and row pattern 126 both comprise a plurality of conducting fingers 128. When the two patterns are aligned to form the keypad 30 as shown in FIG. 4b, the conducting fingers are interdigitated. This configuration gives a large surface area to increase the capacitance change when the finger 33 is proximate to the keypad 30. Also, in this structure, both the column pattern 125 and the row pattern 126 is present in every part of the keypad, so it reduces the chance that the capacitance happens to only one of the row or column.

On the other side of the finger-sensitive substrate 26, conducting material is deposited to form a shielding ground plane 123. This shielding ground plane 123 is electrically coupled to a ground connector 124. In this embodiment, the shielding ground plane 123 is in the shape of a mesh because it has a better shielding effect while reducing the usage of the conducting material.

In operation, the sensor IC 28 sends out square pulses to each input/output port 36 in rotation. If the I/O port 36 is connected to a column conductive wire, the entire column of keypads 30 that is connected to this column conductive wire receives the square pulses. When a finger is proximate to one of the keypads 30 of this column, the capacitance at that keypad 30 increases. As explained in previous paragraphs, the sensor IC 28 will detect this large change of capacitance value and deduce that a finger is presented near one of the keypad 30 of this column. Likewise, when the square pulses passes through a row conductive wire, the entire row of keypads 30 receives the pulse train. If a finger is close to one of the keypads 30 of this row, the input/output port 36 will sense its presence too.

Since the sensor IC 28 sends out square pulses to all input/output ports 36 in rotation, it actually scans and samples whether there is a finger presence in a particular row and column. As a specific example, if a finger is close to keypad in row 5 and column 3, then sensor IC 28 receives a trigger signal from the input/output port 36 connecting to row 5 when it sends square pulses to this row and another trigger signal from input/output port connecting to column 3 when it sends square pulses to this column later. As such, the sensor IC 28 determines that the finger is close to the keypad in coordinate (5, 3). In this matrix arrangement, only (4+7=11) input/output ports are needed to scan the presence of a finger in (4*7=28) keypads (as oppose to requiring 28 input/output ports if matrix arrangement is not used).

The shielding ground plane 123 is incorporated in this layout to make the triggering of the apparatus more stable by minimizing accidental or false triggering. In one embodiment, the ground plane 123 is facing upwards or towards the user. Thus when a finger 33 is proximate to the finger-sensitive substrate 26 not having a keypad 30, the shielding ground plane 123 acts effectively as a shield and prevents any capacitance change at the keypads 30 close to but not directly beneath the finger 33.

When one or more fingers or the palm of a hand that covers an area more than one keypad 30 is on top of the finger-sensitive substrate 26, the sensor IC 28 detects that more than one keypad is triggered. The sensor IC 28 and/or the microcontroller 40 can be programmed in different ways to handle this situation. In one embodiment, control circuit 31 ignores all the trigger signals. In an alternative embodiment, it allows at most two triggers. In yet another embodiment, all triggers will be accepted.

The scanning and detecting process of the sensor IC 28 is defined by a plurality of parameters. For example, the voltage amplitude, frequency of scanning, the time t1 that is defined previously, and the predetermined threshold of sending a trigger signal are important parameters to ensure reliable detection of finger proximating the keypad. In one embodiment, the parameters are loaded from the memory device 44 to the sensor IC 28. The memory device 44 can be an electrically programmable read-only memory (EPROM), a flash memory or a universal serial bus (USB) storage device. In another embodiment, the default parameters are saved inside the sensor IC 28. In yet another embodiment, the parameters are changeable by the user.

As the number of pages in the pliable media 25 provided on top of the keyboard 27 increases, the distance between the keypad 30 and the finger 33 increases, and since capacitance is inversely proportional to distance, the capacitance does not change as much when the finger 33 proximates the keypad 30. The material used for the pages also affects the extent of capacitance change. The parameters need to be set to ensure the finger 33 can be detected in all circumstances.

Detailed circuit layouts and method of measuring capacitance change are thus fully described in the aforementioned embodiments. Although negative edge of square pulse is used, it is clear for those skilled in the art that positive edge and/or other waveforms can also be used to measure the change of time-constant. Furthermore, one can also measure the time it takes for the square pulse to rise or fall to a predetermined voltage to infer the time constant value. The exemplary embodiment is but one method of measuring the change of capacitance. Other methods can also be used and it will fall into the teaching of this disclosure about using the change of capacitance as a mean to detect the presence of a finger near a keypad.

Likewise, FIGS. 4a-4d illustrates one way to make the finger-sensitive substrate 26. Based on the teaching of this disclosure, those skilled in the art can construct similar keyboards in a variety of configurations. For example, the keyboard can be configured for different number of rows and columns to suit the developer's need. The keypad pattern as shown in FIGS. 4b and 4c can assume different shapes, not necessary circular as shown. And one can also adopt different kinds of mesh patterns in designing the shielding ground plan. As such, there can be numerous combinations of configurations and all these variations should also fall into the teaching of this disclosure.

Refer back to FIG. 1, there are a plurality of combinations to package the different components shown in the figure into the finger-sensing apparatus 23. In one embodiment, all the components are placed into one integrated package. In this case, the pliable media 25 is not separable from the other components.

Figure 5A:
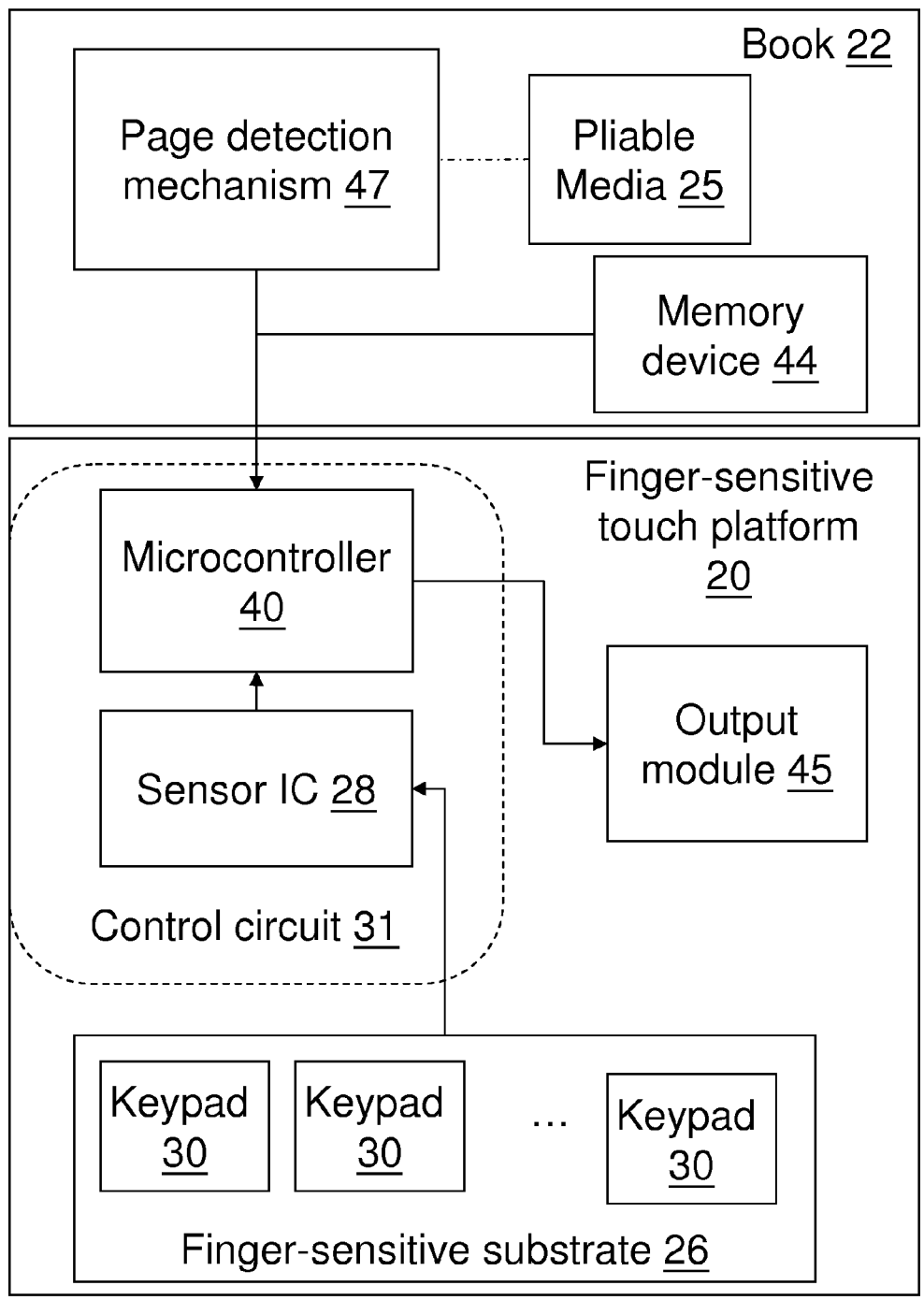
FIG. 5a is a block diagram of an exemplary embodiment of the invention, with the book separated from the finger-sensitive touch platform.

In an alternative embodiment as shown in FIG. 5a, the pliable media 25, the page detection mechanism 47 and the memory device 44 is packaged together in the form of a book 22 while the rest of the components form a base unit. The base unit, referred as the finger-sensitive touch platform 20, comprises at least one finger-sensitive substrate 26 with keypads 30, the control circuit 31 and the output module 45. The book 22 is separate from the finger-sensitive touch platform 20 but can be attached to the unit. Electrical connectors (not shown) are provided at both the book 22 and the finger-sensitive touch platform 20 so that when attached, the components at the book 22 are electrically connected to the components of the base unit. Power supply (not shown) is also housed in the finger-sensitive touch platform 20 and supply power to the book 22 through the connectors.

Figure 5B:
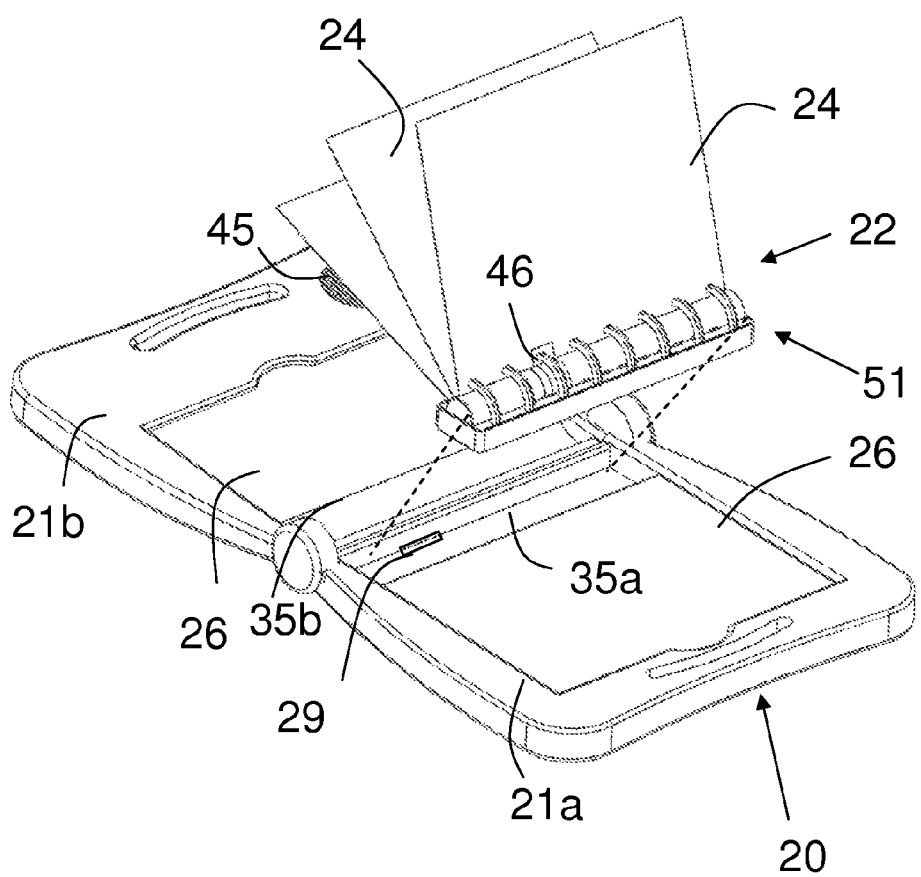
FIG. 5b is a perspective view of a realization of the exemplary embodiment in FIG. 5a with the book separated from the finger-sensitive touch platform.
Figure 5C:
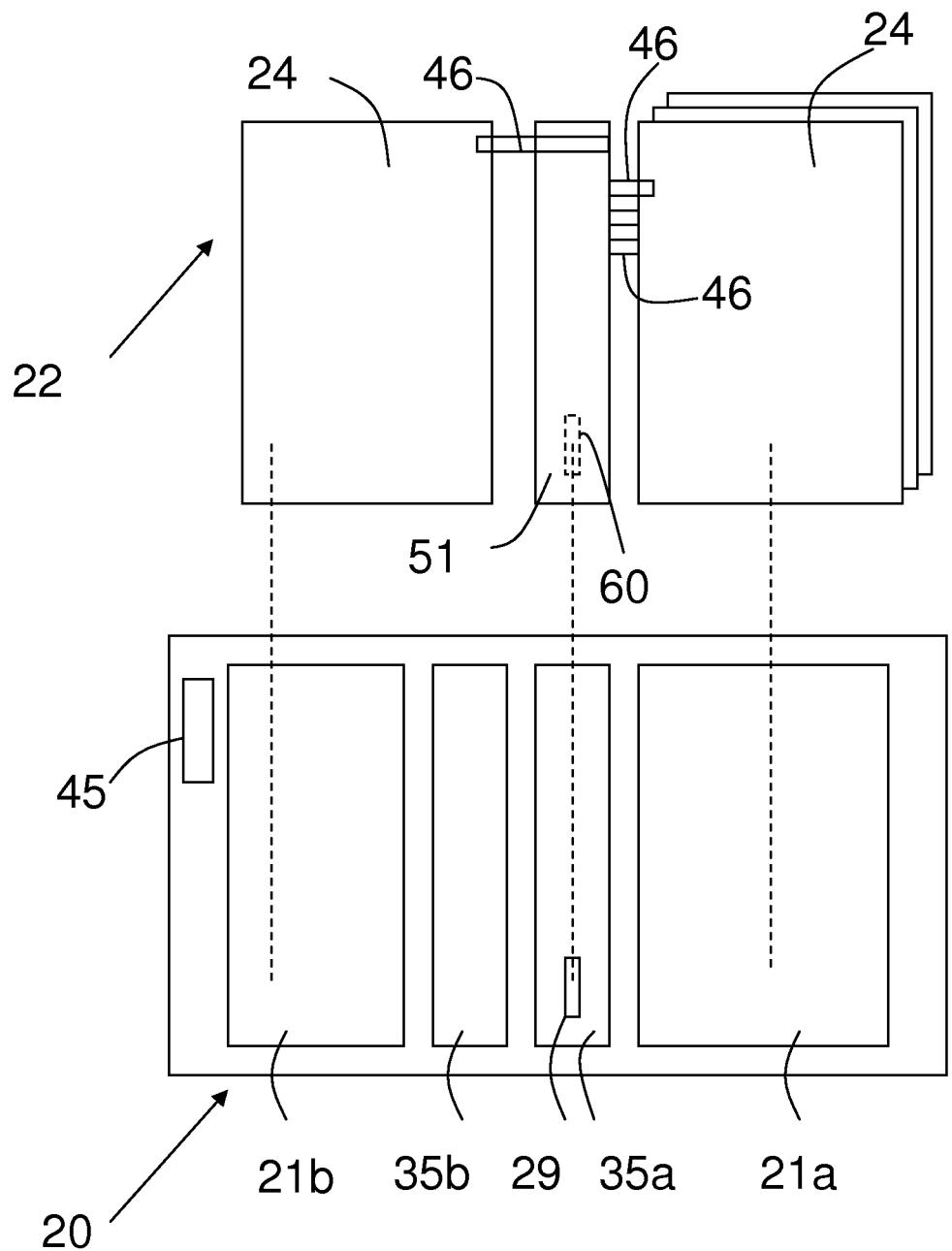
FIG. 5c is a figurative assembly diagram of the embodiment of FIG. 5b.

An exemplary illustration of this alternative embodiment is illustrated in FIGS. 5b and 5c. The finger-sensitive touch platform 20 comprises a right platform 21a and a left platform 21b, both of which having a finger-sensitive substrate 26 attached on a surface. A right spine slot 35a and a left spine slot 35b are also provided. A connector slot 29 is provided inside the right spine slot 35a. The book 22 comprises a plurality of pages 24 with each page 24 attached to one of a plurality of pliable strips 46. Each pliable strip 46 is then attached to a different position of a page detection spine 51 that acts as both the spine of the book 22 and the page detection mechanism 47. The page detection spine 51 further comprises a printed circuit board (not shown) that houses all the electronic components in the book 22, together with an electrical connector 60 that is adapted to insert into the connector slot 29 of the finger-sensitive touch platform 20. A more detailed description of the structure of an exemplary embodiment of the page detection spine 51 is provided below.

In operation, the page detection spine 51 of the book 22 is inserted into the connector slot 29 of the finger-sensitive touch platform 20. The detection of finger presence and page is as the same as described above. When the sensor IC 28 sends a trigger signal to the microcontroller 40, the latter reads the multimedia object from the memory device 44 corresponding to the keypad 30 being proximated and the page 24 that is exposed to the user. The multimedia object is then presented to the user through the output module 45.

In one embodiment, the output module 45 is an audio unit that comprises a digital to analog converter, an amplifier and a loudspeaker that outputs audio content. In another embodiment, the output module 45 is a display device that outputs both audio and video content. In yet another embodiment, the output module 45 comprises at least one electrical connector that can be used to couple to an external output device.

It is clear that one skilled in the art can alter the placement of any of the components to be either with the finger-sensitive touch platform 20 or with the book 22 but still lie within the scope of the invention. For example, the page detection mechanism 47 and/or the memory device 44 can be packaged with the touch-sensitive touch platform 20. Alternatively, part or all of the control circuit 31, as well as the output module 45, may be integrated to the book 22.

Figure 6:
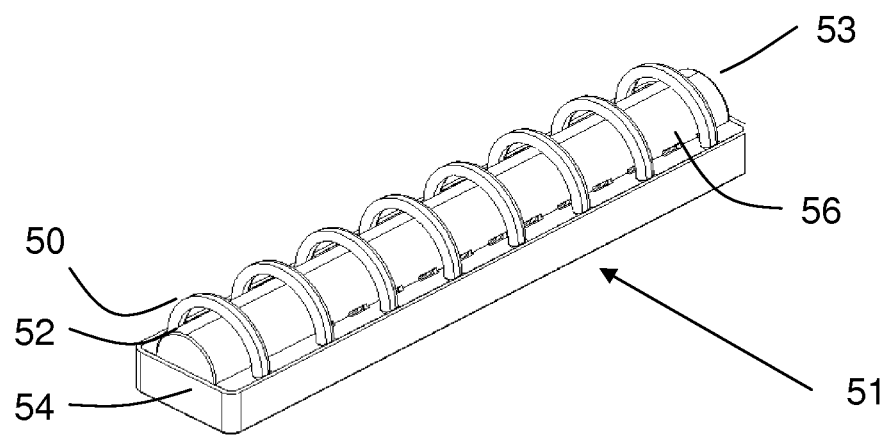
FIG. 6 is a perspective view of a page detection spine according to an exemplary embodiment.
Figure 7:
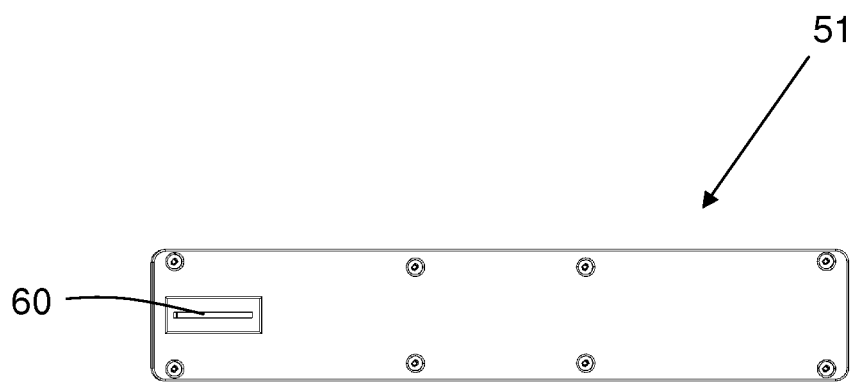
FIG. 7 is a bottom view of the page detection spine of FIG. 6.

An exemplary embodiment of a page detection spine 51 is described in FIGS. 6 and 7. A plurality of rings 50 is provided to attach to the plurality of pages of the book 22 (not shown in figure). The rings 50 are attached to a top piece 52, which is then attached to a bottom piece 54. The top piece 52 has a semi-circular ridge 53 along its longitudinal axis, and slits 56 are opened at the right side of the semi-circular ridge 53. The electrical connector 60 is provided at of the bottom of the bottom piece 54.

Figure 8:
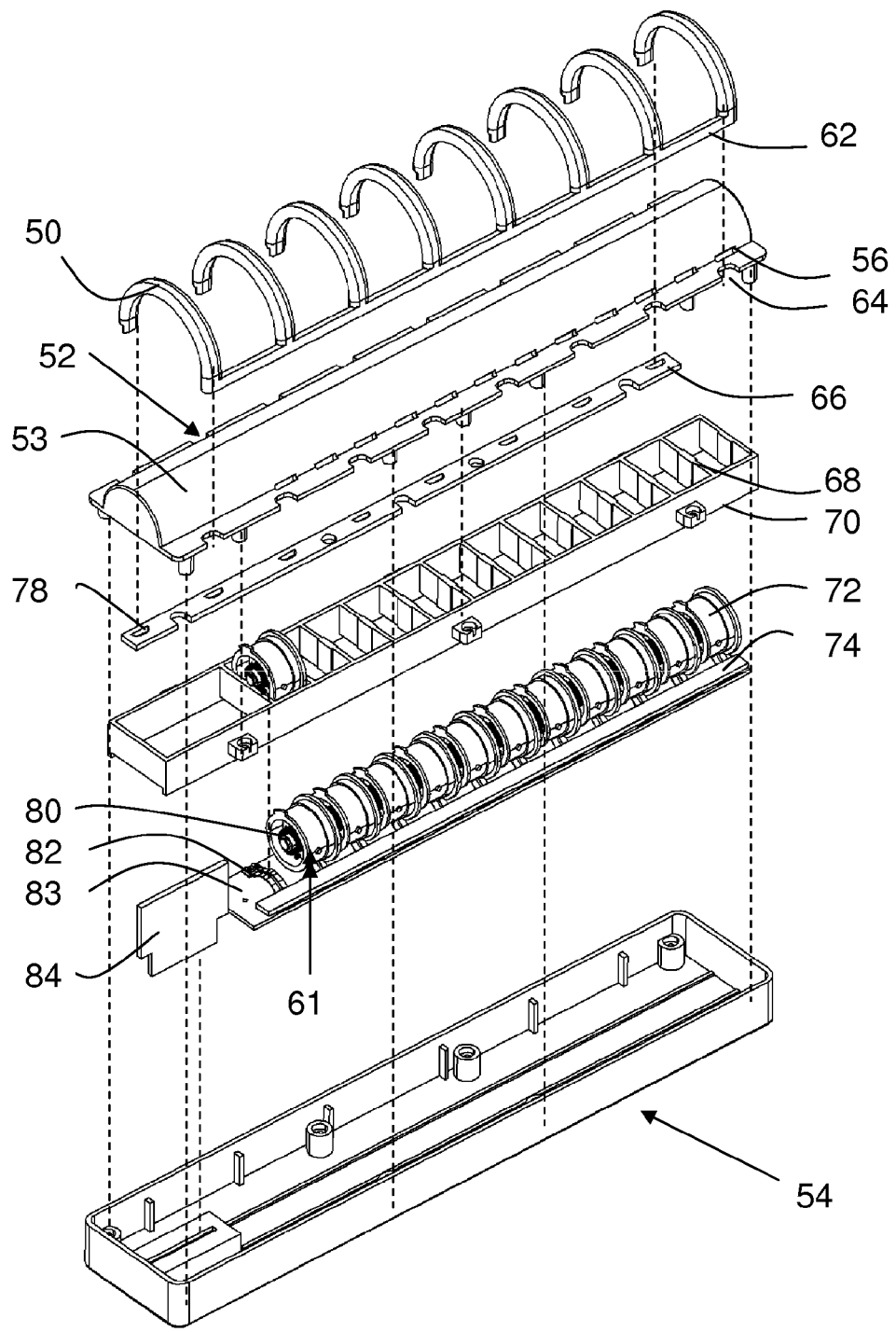
FIG. 8 is an exploded assembly perspective view of the page detection spine of FIG. 6.

The structure of page detection spine 51 is illustrated in more detail in an exploded assembly diagram as shown in FIG. 8. The rings 50 are joined together by an attaching bar 62 at one end. The rings 50 are inserted into a plurality of ring slots 64 of the top piece 52, so that the attaching bar 62 is under the top piece 52 when attached. A side piece 66 having a plurality of ring inserts 78 is provided below the top piece 52, such that the rings 50 are removably attached to the ring inserts 78. Between the top piece 52 and the bottom piece 54 is a middle piece 70 that is attached to the top piece 52. The middle piece 70 has a plurality of inside walls 68. Between the inside walls 68 lies a plurality of detection units 61, the structure of which is more thoroughly described in the next paragraph. A first printed circuit board (PCB) 84 having the memory device 44 is provided to be inserted into the connector slot 29 of the finger-sensitive touch platform 20 through the electrical connector 60.

Figure 9:
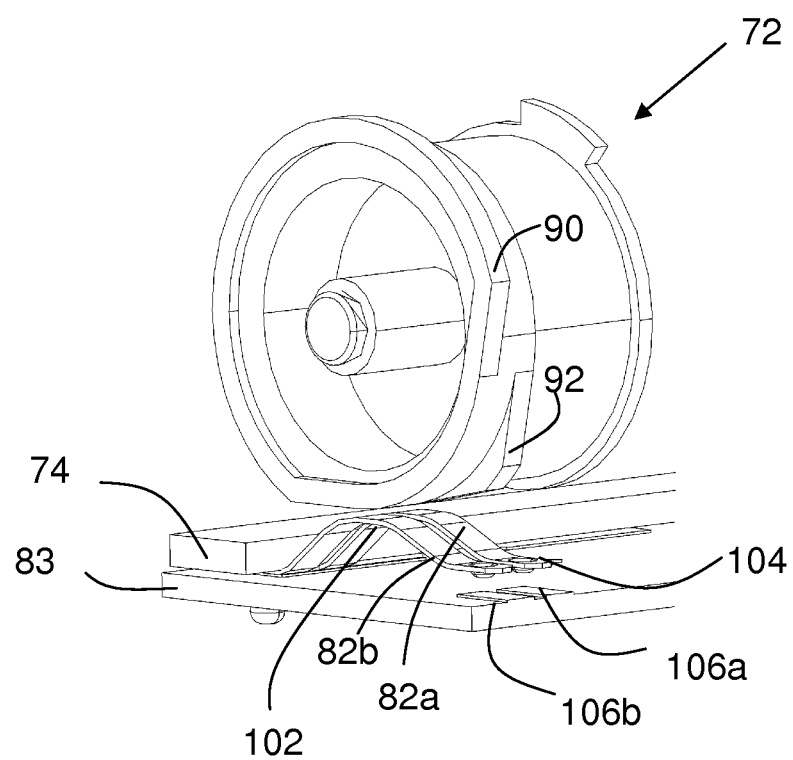
FIG. 9 is a front elevated view of a rotating unit according to an exemplary embodiment.

Referring to FIG. 9, each detection unit 61 comprises a wheel 72 resting on the inside walls 68, and below the wheel 72 are a first metal cantilever 82a and a second metal cantilever 82b. The position of the wheel 72 is limited by the inside walls 68 and the semi-circular ridge 53 of FIG. 6. Each metal cantilever includes an elevated middle part 102 and a distal end 104. A first metal pin 106a is provided right under the distal end 104 of the first metal cantilever 82a and a second metal pin 106b is provided right under the distal end 104 of the second metal cantilever 82b on a second PCB 83, with a narrow gap in between. The metal cantilevers are attached and coupled to the second PCB 83, and are covered and fixed in place at an end by a cover strip 74. The second PCB 83 is also coupled to the first PCB 84 of FIG. 8. A spiral spring 80 is attached to the wheel 72, and the structure is described in the following paragraph.

Figure 10A:
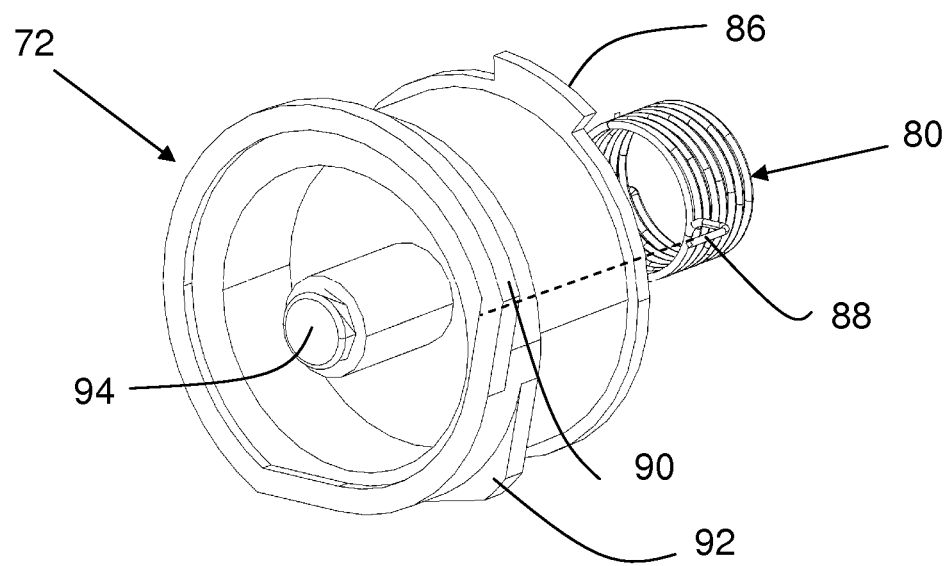
FIG. 10*a* is a perspective view of a wheel and a spiral spring in FIG. 9.
Figure 10B:
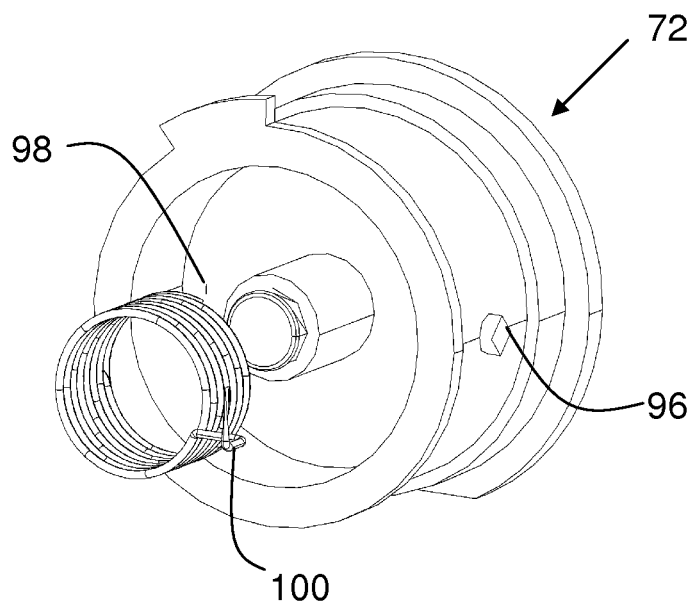
FIG. 10*b* is a perspective view of FIG. 10*a* at the opposite side.

A more detailed view of the wheel 72 and the spiral spring 80 is shown in FIG. 10. The spiral spring 80 have a wheel end 88 and an axle end 100. A mouth 98 is opened at the wheel 72 and the wheel end 88 of the spiral spring 80 is inserted into the mouth 98. The axle end 100 of the spiral spring 80 rests on the inside wall 68 of FIG. 8. A first contact plane 92 and a second contact plane 90 are formed at the outside edge of the wheel 72. A strip attachment knob 96 is also made at the outside edge of the wheel 72 to attach to the pliable strip 46 of FIG. 5c that is in turn attached to one of the pages 24 of FIG. 5c. An axle 94 is provided for resting on the inside walls 68 while allowing rotary motion. A stopper 86 is also provided to prevent over-rotating of the wheel 72.

The spiral spring 80 is supported at their two ends by the wheel 72 and the inside wall 68. When a page 24 is flipped from the right side to the left side, the pliable strip 46 pulls the wheel 72 so that it rotates while at the same time the spiral spring 80 contracts. When the page is flipped the other way, the spiral spring 80 unwinds to return the wheel 72 into its initial position.

Figure 11:
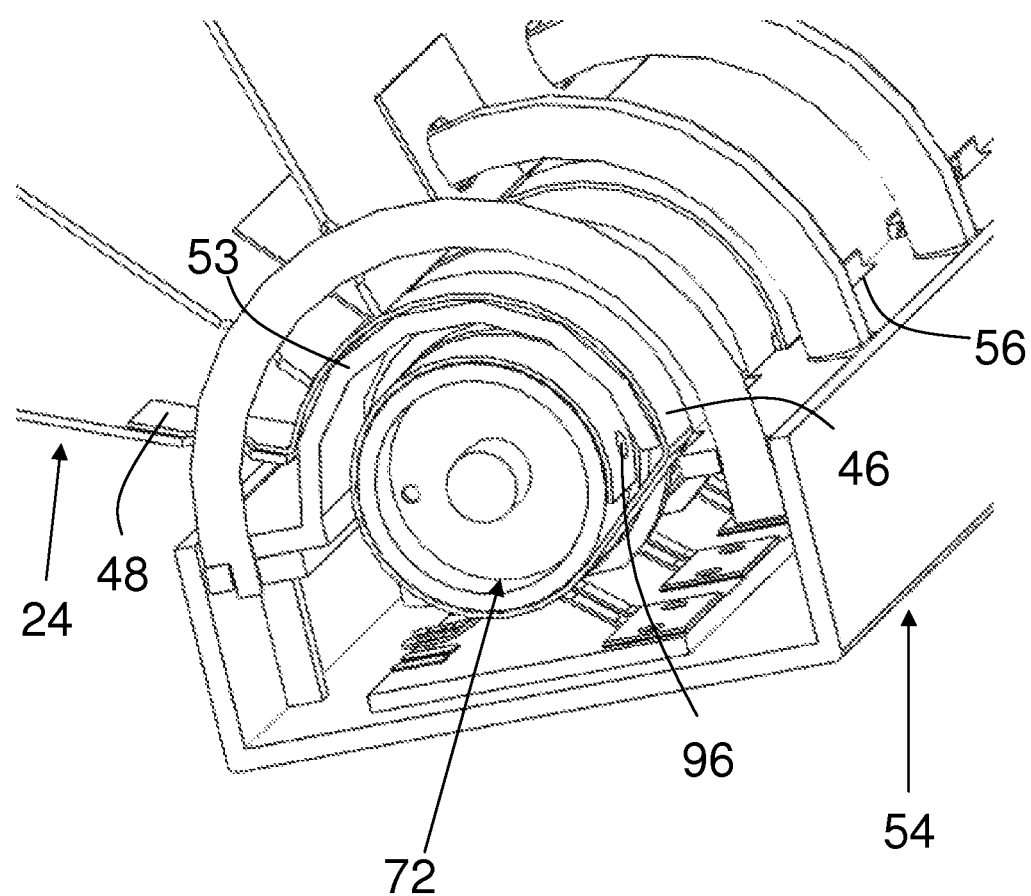
FIG. 11 is a perspective view of the page detection spine showing the attachment of the pliable strip to the page according to an exemplary embodiment.

FIG. 11 shows a diagram of the attachment of the pages 24 to the page detection spine 51 at a flipped position. One end of the pliable strip 46 is attached to the strip attachment knob 96 of the wheel 72. The pliable strip 46 then wraps around the wheel 72 from the top and through the bottom. Then it goes through the slit 56 and wraps around the surface of the semi-circular ridge 53. The other end of the pliable strip 46 is labeled as an attaching end 48 and is attached to the page 24.

Figure 12:
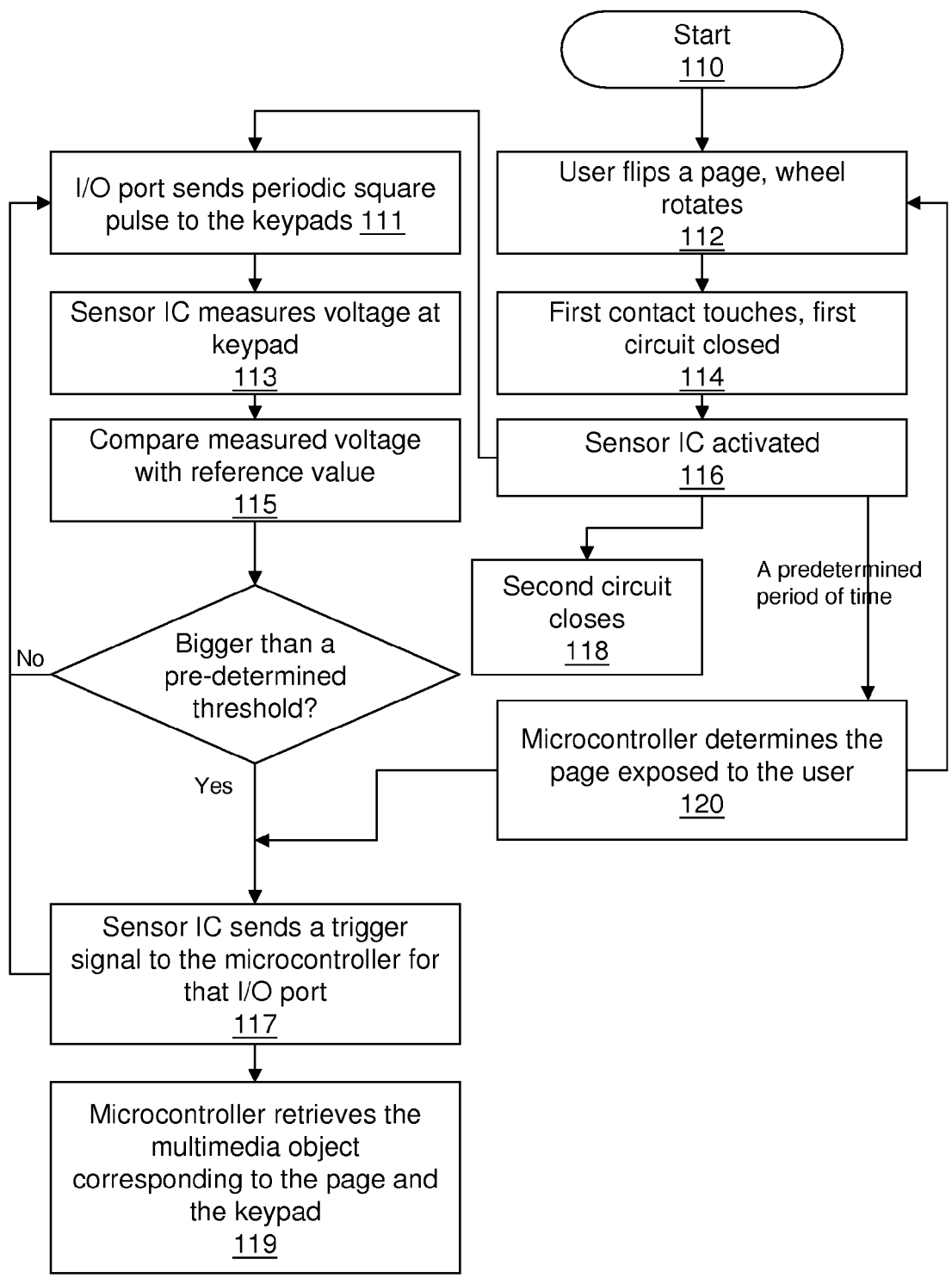
FIG. 12 is a block diagram of the operation flow chart of an exemplary embodiment.

A flow chart of the operation of the module is shown in FIG. 12. First, the power is turned on (step 110). Even the power is turned on, the system including the sensor IC 28 is not always activated. Rather, part or all of the electronic components are put to a sleep mode to reduce electric power when the book is not used for a certain period of time. In the sleep mode, the sensor IC 28 does not send square pulses towards the keypads 30. When a page 24 is flipped (step 112), the pliable strip 46 attached to that page causes the corresponding wheel 72 to rotate. As the wheel 72 rotates, the first contact plane 92 touches and pushes down the middle part 102 of the first metal cantilever 82a. In turn, the distal end 104 touches the first metal pin 106a to close a first circuit (step 114). When the first circuit is closed, all those components that are in sleep mode, including the sensor IC 28, are activated (step 116). The sensor IC 28 starts sending square pulses from each I/O port 36 to the keypads 30 (step 111). The wheel 72 continues to rotate, and when the corresponding page 24 is at a fully flipped position, the wheel 72 pushes down the second cantilever 82b in a similar fashion and closes a second circuit (step 118). The second circuit is continuously closed while the first circuit is only closed momentarily when the wheel 72 is rotating. After a predetermined period of time from the time that the first circuit closes, the microcontroller 40 determines the page 24 exposed to the user by detecting the signals generated by the second circuits from different wheels 72 (step 120). For example, if a second circuit corresponding to a first page is continuously closed and the second circuit corresponding to the page next to the first page is continuously open, the microcontroller 40 will determine this first page as exposed to the user and send the page number of the first page to the microcontroller 40.

When the I/O port 36 starts sending periodic square pulse to the keypads (step 111), the sensor IC 28 periodically measures the voltage of the keypad 30 (step 113). This measured voltage is compared to the reference value (step 115). If the voltage detected is significantly larger than the reference value, the I/O port 36 is triggered and a trigger signal is sent to the microcontroller 40 (step 117), otherwise it will not trigger and will wait for next cycle. Based on the trigger signal(s) received, the microcontroller 40 retrieves the multimedia object stored in the memory device 44 corresponding to the keypad 30 and the page 24 is presented to the user through the output module 45 (step 119).

If electric power is provided continuously to connectors to memory device 44, the electronic components in the book 22 may experience a sudden surge or disruption of power when electric connector 60 is inserted or removed from the connector slot 29. This may cause damages to those components. In one embodiment, the power supply to the memory device 44 is delayed by a short period of time after the book 22 is coupled to the finger-sensitive touch platform 20. This implementation reduces the chance that lingering charges at connectors damaging the electronic components in the book 22.

The embodiments of the present invention are thus fully described. Although the description referred to particular embodiments, it will be clear to one skilled in the art that the present invention may be practiced with variation of these specific details. Hence this invention should not be construed as limited to the embodiments set forth herein.

For example, the finger-sensitive substrate 26 can be made of a variety of materials so long as it serves the purpose described herein. It may be a printed circuit board in one embodiment, or it can be a flexible, pliable membrane made of plastic material.

The interdigitated finger structures of the column pattern 125 and the row pattern 126 are just an example and it is clear and obvious that other shapes are also possible to be deposited. In an embodiment, the patterns are in the form of concentric rings, with the rings coupled to the column conductive wire and the row conductive wire alternately.

The material used for the pages 24 of pliable media 25 is not limited to paper. For example, the pages 24 can be made of plastic, for example projector transparencies. As long as the material is pliable and does not affect the detection of the finger 33 proximating the keypad 30, it can be used in this invention.

The shape of the ground layer 32 mentioned above is just an example, and it is clear that any arbitrary shape used can serve similar function. In one embodiment, the ground layer 32 is a solid plate. In another embodiment, circular holes are made in the ground layer 32 instead of square holes which correspond to a mesh shape.

The reference value does not need to be the voltage measured for the previous pulse. In one embodiment, the reference value is an average of the voltage measured for a past certain number of pulses. In an alternative embodiment, the reference value is an average of the voltage detected for all I/O ports 36 for the previous pulse.

The embodiments above mentioned a predetermined threshold of the voltage difference for triggering of the I/O port 36. However, it does not need to be a single threshold. In an alternative embodiment, there are two thresholds. If the change of the voltage is within the range of a first threshold, the reference value is updated with this change and no trigger signal is generated. If the change of voltage is higher than a second threshold, then a trigger signal is generated. If the voltage change is between the first threshold and the second threshold, the reference is not updated and no trigger signal is generated.

What is claimed is:

1. An interactive electronic book comprising:
   a substrate comprising at least one finger-sensitive sensor that senses a finger of a user;
   a pliable media including at least one page with at least one site, said pliable media removably attached on top of said substrate;
   a page detection mechanism that determines a page exposed to the user;
   a control circuit that receives an indication from the page detection mechanism of a current page being displayed and an indication from the finger-sensitive touch sensor of a location on the page being touched by the user;
   a memory device coupled to said control circuit and storing at least one multimedia object, each of said at least one multimedia object corresponds to one of said site of said page;
   a multimedia output device coupled to said control circuit that presents said at least one multimedia object to said user;
   wherein said pane detection mechanism comprises:
      a strip attached to different locations of said page;
      a strip detecting circuit coupled to said control circuit;
      wherein when said strip moves from a first position to a second position as the user flips the page; the strip detecting circuit detects the movement of said strip and sends out at least one signal to said control circuit, indicating the page that is exposed to said user;
      wherein said strip detecting circuit generates a first signal when said strip is at a third position that is between said first position and said second position and generates a second signal when said strip is at said second position and also after a predefined period of time when said first signal is generated.

2. The book according to claim 1, wherein said substrate is a pliable membrane.

3. The book according to claim 1, wherein said finger-sensitive sensor is a capacitive sensor.

4. The book according to claim 1, wherein said memory device is attached to said pliable media.

5. The book according to claim 1, wherein said multimedia object is an audio message.

6. The book according to claim 1 wherein said first signal is used to activate said control circuit and said memory device.

7. The book according to claim 1, wherein said pliable media is bound to a spine.

8. The book according to claim 7, wherein said memory device is attached to said spine.

9. A method of using an interactive electronic book, comprising the steps of:
   providing a substrate comprising at least one finger-sensitive sensor that senses a finger of a user;

providing a pliable media including at least one page with at least one site, said pliable media removably attached on top of said substrate;

providing a page detection mechanism that determines a page exposed to said user;

providing a control circuit that receives an indication from said page detection mechanism of a current page being displayed and an indication from said finger-sensitive sensor of a location on said page being touched by said user, wherein said page detection mechanism comprises a strip attached to different locations of said page and a strip detecting circuit coupled to said control circuit, wherein when said strip moves from a first position to a second position as said user flips said page; said strip detecting circuit detects the movement of said strip and sends out at least one control signal to said control circuit, indicating said page that is exposed to said user; wherein said strip detecting circuit generates a first signal when said strip is at a third position that is between said first position and said second position and generates a second signal when said strip is at said second position and also after a predefined period of time when said first signal is generated;

providing a memory device coupled to said control circuit and storing at least one multimedia object, each of said at least one multimedia object corresponds to one of said site of said page;

providing a multimedia output device coupled to said control circuit that presents said at least one multimedia object to said user;

determining which one of said at least one page is displayed to said user;

detecting a presence of said finger of said user when said finger is proximate said site in said page before said finger actually touches said site in said page; and activating said multimedia object that corresponds to said site on said page.

10. The method according to claim 9, further comprising:

moving said user finger in the vicinity of said at least one finger-sensitive sensor;

detecting a change in at least one characteristic at said at least one finger-sensitive sensor.

11. The method according to claim 10, wherein said characteristic is capacitance, and said detecting step further comprising:

sending a square pulse from said control circuit to said finger-sensitive sensor;

measuring a voltage at a pre-determined interval relative to said square pulse; said voltage directly correlated to said capacitance of said finger-sensitive sensor;

computing a difference between said voltage and a reference voltage, and deducing said finger is detected when said difference is higher than a pre-determined threshold.

* * * * *